United States Patent [19]
Yokoyama

[11] 3,987,399
[45] Oct. 19, 1976

[54] RADIO RECEIVER

[75] Inventor: Susumu Yokoyama, Tokyo, Japan

[73] Assignee: Pioneer Electronic Corporation, Tokyo, Japan

[22] Filed: Sept. 8, 1975

[21] Appl. No.: 611,103

[30] Foreign Application Priority Data
Sept. 11, 1974 Japan.............................. 49-103819
Sept. 25, 1974 Japan.............................. 49-110258

[52] U.S. Cl................................. 325/418; 331/19; 325/422
[51] Int. Cl.²......................................... H04B 1/26
[58] Field of Search ........... 325/416, 417, 418, 420, 325/422, 492, 344, 346, 348; 331/1 A, 4, 19; 334/14, 15, 16

[56] References Cited
UNITED STATES PATENTS
| | | | |
|---|---|---|---|
| 3,806,817 | 4/1974 | Uchida................................ | 325/418 |
| 3,869,674 | 3/1975 | Borbely............................... | 325/422 |
| 3,889,193 | 6/1975 | Sasaki et al...................... | 325/418 X |

*Primary Examiner*—Benedict V. Safourek
*Attorney, Agent, or Firm*—Sughrue, Rothwell, Mion, Zinn and Macpeak

[57] ABSTRACT

A radio receiver using an oscillator to generate a desired frequency at equal intervals as a local oscillator is disclosed. The radio receiver includes a time constant circuit initiated by turning on the receiver power supply. A pulse signal generator is controlled by the time constant circuit and generates a pulse after a desired time. This pulse is applied to the local oscillator to vary temporarily its oscillating frequency, thereby enabling the oscillating frequency of the local oscillator to be pulled into a frequency corresponding to a desired broadcasting station. A control voltage generator responsive to the IF amplifier and detector of the receiver operates to block the output of the pulse signal generator when it is detected that the frequency of the local oscillator has pulled into the frequency corresponding to the desired broadcasting station. A muting circuit is responsive to the pulse signal generator to prevent an output from the receiver until the frequency of the local oscillator has pulled into the frequency corresponding to the desired broadcasting station.

11 Claims, 5 Drawing Figures

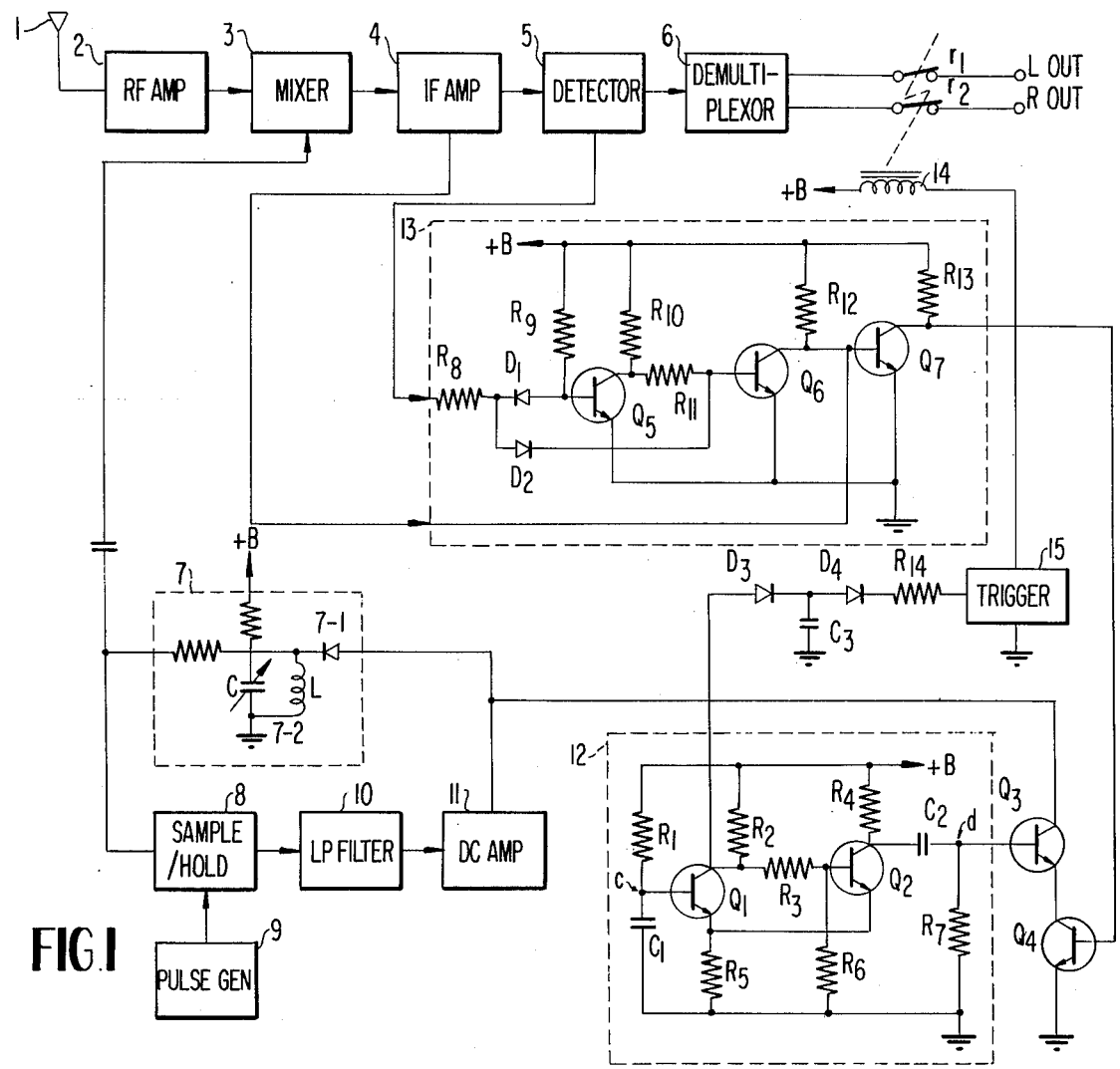
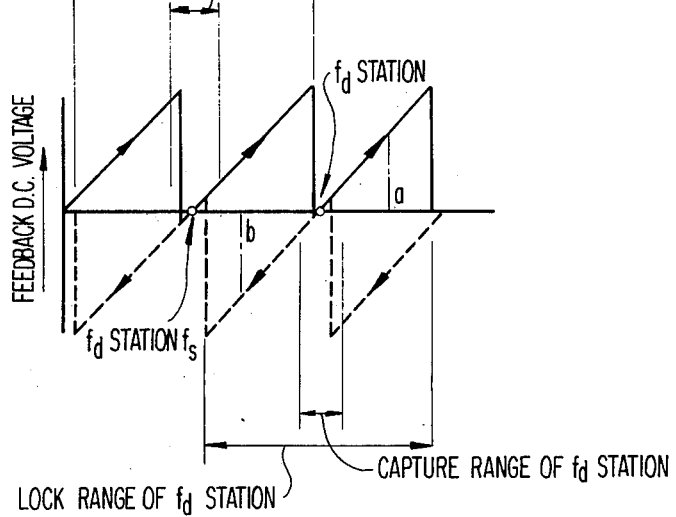

3,987,399

RADIO RECEIVER

CROSS-REFERENCE TO RELATED APPLICATION

The radio receiver disclosed herein employs as its local oscillator the circuit disclosed in co-pending patent application Ser. No. 554,044 filed Feb. 28, 1975, by Takuo Mouri for "Oscillator for Generating Frequencies Distributed at an Equal Interval" and assigned to the assignee of this application.

BACKGROUND OF THE INVENTION

1. Field of the Invention

The present invention generally relates to improvements in radio receivers wherein a local signal is generated with frequencies at equal intervals, and more particularly to improvements in such radio receivers which prevent the special lock deviation phenomenon generally associated therewith when power is turned on and which additionally prevent unwanted output signals generated during the re-locking operation.

2. Description of the Prior Art

In FM broadcasting now carried out in Japan, the frequency range is 76–90 MHz, and the carrier frequencies are spaced every 100 KHz. Therefore, a desired condition required for the local oscillator is that stable frequencies can be produced at intervals of 100 KHz within the range of 65.3 to 79.3 MHz, which is obtained by taking the intermediate frequency of 10.7 MHz from the broadcasting frequency range of 76 to 90 MHz. This is accomplished by using as the local oscillator in the receiver the oscillator disclosed in the above-referenced patent application Ser. No. 554,044. However, when the power is turned on in such a receiver, a special frequency lock deviation phenomenon often occurs which causes the local oscillator to lock onto a frequency corresponding to a broadcasting station at a lower frequency than the one desired. In addition, in the process of correcting for this condition, undesirable noises are generated at the output of the receiver.

SUMMARY OF THE INVENTION

According to the present invention, the technique disclosed in the above-referenced application Ser. No. 554,044 is used to provide a frequency synthesizer tuner in a radio receiver, but in addition, a re-lock circuit is also provided so as to prevent the radio receiver from exhibiting the special frequency lock deviation phenomenon generally associated with this type of tuner. In addition, noise generated during the operation of re-lock is eliminated by a muting circuit. More specifically, the radio receiver according to the invention includes a time constant circuit initiated by turning on the receiver power supply. A pulse signal generator is controlled by the time constant circuit and generates a pulse after a desired time. This pulse is applied to the local oscillator circuit to temporarily vary its oscillating frequency. This enables the oscillating frequency of the local oscillator to be pulled into the frequency corresponding to the desired broadcasting station. When this occurs, the output of the pulse signal generator is blocked. During this process, the output of the receiver is muted to prevent the generation of undesirable noises.

BRIEF DESCRIPTION OF THE DRAWINGS

The specific nature of the invention as well as other objects, aspects, uses and advantages thereof, will clearly appear from the following description and from the accompanying drawing, in which:

FIG. 1 is a block and circuit diagram of a radio receiver according to a preferred embodiment of the invention;

FIG. 2 is a graph of the DC feedback voltage as a function of frequency for controlling the oscillating frequency of the local oscillator;

DESCRIPTION OF THE PREFERRED EMBODIMENTS

Figure 3:
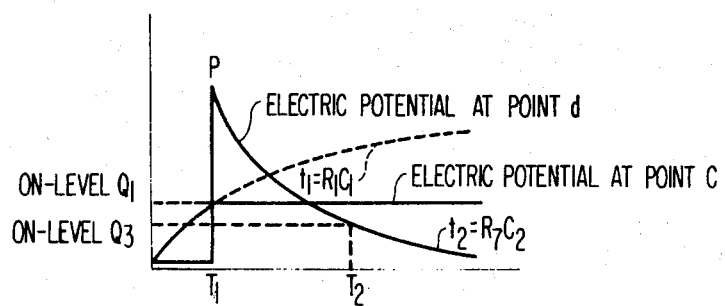
FIG. 3 is a graph of voltage as a function of time illustrating the sequence of operations of a time constant circuit and a Schmitt trigger circuit in the radio receiver according to the invention.

FIG. 1 is a radio receiver of this invention, a part of which is shown by block diagram, in which 1 is an antenna, 2 is a radio frequency amplifier circuit, 3 is a mixing circuit, 4 is an IF circuit, 5 is a detector circuit, and 6 is an FM multiplex circuit which provides left and right output signal terminals $L_{out}$ and $R_{out}$ through contacts $r_1$ and $r_2$ of a relay 14 later described. Since the respective operations of circuits shown by blocks 1–6 are the same as those of well known FM stereophonic receivers, the explanation is omitted.

Now, the circuit shown by blocks 7–11 is the equal interval frequency oscillator disclosed in the above-referenced application Ser. No. 554,044, in which an output signal from a variable frequency oscillator (hereinafter designated VFO) shown by 7 is applied to the mixing circuit 3 as a local signal. In this case, the local signal is applied to a sample and hold circuit 8, at which the local signal is sampled and held in response to a signal from a pulse signal generator 9 whose period corresponds to 100 KHz. The DC component of the sampled signal is passed by a low pass filter 10, and the DC signal is applied to a variable capacitance diode 7–1 of VFO 7 through a DC amplifier 11. Accordingly, the frequency of VFO 7 is automatically controlled by the feedback of the DC control voltage, and the oscillating frequency is discontinuously varied at equal intervals of 100 KHz as the value of condenser C in an L-C resonant circuit 7–2 provided in VFO 7 is in turn changed. The change in condition of the feedback DC voltage in the equal interval frequency oscillator is shown in FIG. 2. That is, when the resonant frequency at the L-C resonant circuit 7–2 is shifted from a low frequency to a high frequency (transferred from left to right in FIG. 2), the DC feedback current is in turn varied as shown by the solid lines, and the oscillating frequency is raised by 100 KHz each period in the saw tooth characteristic. On the other hand, when the resonant frequency is shifted from a high frequency to a low frequency (transferred from right to left), the DC feedback current is varied relative to the solid lines as shown by dotted lines, and similarly the oscillating frequency is lowered by 100 KHz each period in the saw tooth characteristic. Accordingly, assuming that a station corresponding to frequency $f_d$ is being received at present as shown in FIG. 2, a comparatively wide lock range is generated with respect to that station because of the AFC action applied to VFO 7 by the DC feedback voltage. When the condition of the local oscillator at a time when the station is being received by such AFC action is present in the lock range deviates from a capture range, the frequency at VFO 7 is often not re-locked to the previous local oscillating frequency after the power supply has been turned off and again turned on. In this case, a tuning operation for obtaining the most suitable tuning point is required. Describing further the condition in detail, the following three modes may be considered in the condition receiving the station corresponding to frequency $f_d$.
1. Within the capture range of the station.
2. Within a higher lock range (point $a$) deviating from the capture range of the station.
3. Within a lower lock range (point $b$) deviating from the capture range of the station.

Figure 4:
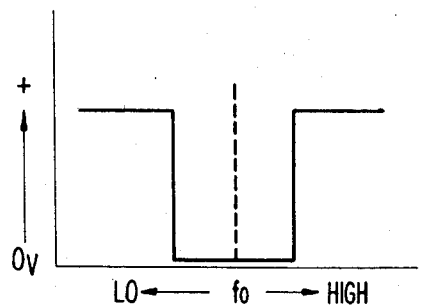
FIG. 4 is a graph showing the waveform of a control signal generated in the radio receiver according to the invention.

In the case of (1), the radio receiver may be locked to the desired station as soon as the power supply is turned on, and in the case of (2) the oscillating frequency at VFO may approach to a stationary frequency from the lower frequency when the power supply is turned on. Therefore, the oscillating frequency at VFO may surely pass the capture range of the station, and then lock to the station at this time. In the case of (3), however, since the oscillating frequency is not entered to the capture range of the station when the power suppy is turned on, it may be locked to $f_d - f_s$ corresponding to the frequency which is lower than the desired station by 100 KHz, and the station being received before the power supply was turned off is not received. In order to avoid the condition described in the case (3), the radio receiver of this invention is provided with a pulse signal generator 12 shown in FIG. 1, so that the capacitance of the variable capacitance diode 7–1 is temporarily decreased by a pulse from the pulse signal generator 12 after the power suppy is turned on, thereby causing the oscillating frequency to enter the capture range of the desired station. The pulse signal generator 12 comprises time constant circuit $R_1$ and $C_1$, a Schmitt trigger circuit $Q_1$, $Q_2$ and $R_2$ – $R_6$, and a differentiation circuit $C_2$ and $R_7$. Now, when the power supply is turned on, a voltage is applied to the time constant circuit and the terminal voltage (point c) at condenser $C_1$ increases as indicated by curve $\tau_1$ in FIG. 3. In FIG. 3, when the time proceeds to $T_1$, the Schmitt trigger circuit is turned on, and a pulse signal P is generated at the output terminal (point d) of the differentiation circuit, and then the pulse signal is applied to a base of a first transistor $Q_3$ of an AND circuit. On the other hand, a control voltage shown in FIG. 4 is applied to a base of a second transistor $Q_4$ of the AND circuit. The control voltage is generated by a control voltage generator circuit 13 shown in FIG. 1. Both the output of IF circuit 4 and the DC output (so-called S curve voltage) of FM detector circuit 5 are applied to the control voltage generator circuit 13. The DC output of FM detector circuit 5 is applied to diodes $D_1$ and $D_2$ through a resistor $R_8$. In the case where the detector output is positive, the positive voltage is applied to a base of a transistor $Q_6$ through the diode $D_2$. On the other hand, in the case where the detector output is negative, a transistor $Q_5$ is kept at a cut off condition through the diode $D_1$, thereby applying a desired positive voltage to the base of the transistor $Q_6$. Accordingly, the synthetic action is that the detected DC output is full wave rectified. On the contrary, since the IF output is applied to the collector of the transistor $Q_6$, a signal corresponding to the product of full wave rectified component of the detected DC output and the IF output is applied to a base of a transistor $Q_7$, so that the control voltage varying rectangularly as shown in FIG. 4 will be generated at the collector of the transistor $Q_7$. The control voltage is almost zero when it is present in the capture range of the desired station which is broadcasting. Accordingly, the AND function of the AND circuit will not be established, and the local oscillating frequency will be locked to $f_d$ corresponding to the desired station. However, in the case where the local oscillating frequency is deviated from the capture range of the desired station and the power supply is turned on at a lower lock range (point b), since a desired control voltage is generated from the control voltage generator circuit 13, the second transistor $Q_4$ in the AND circuit will be turned on and then the first transistor $Q_3$ will be turned on by a pulse from the pulse signal generator 12. Accordingly, since the anode voltage of the variable capacitance diode 7–1 is temporarily lowered, the capacitance of the variable capacitance diode 7–1 will be decreased so that the local oscillating frequency will be temporarily shifted. At this time, because the local oscillating frequency may pass within the capture range of the desired station, it will be locked to this station.

In a re-locking operation, however, after the power supply is turned on, the local oscillating frequency is first tuned to $f_d - F_s$, and then re-locked to $f_d$ by the generation of the pulse signal. Therefore, if a radio wave, for example, is present at $f_d - f_s$, the broadcasting may be received in such a mode, and then the received broadcasting may be changed to the adjacent $f_d$ frequency. In addition, if the radio wave is not present at $f_d - f_s$, noises generating between broadcasting stations may first be caused as soon as the power supply is turned on, and then the desired station may be received. This is unpleasant for the listener.

Figure 5:
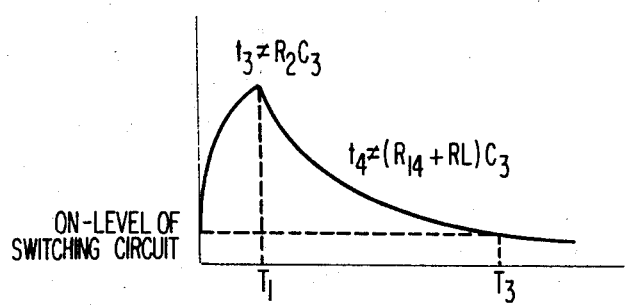
FIG. 5 is a graph showing the charge and discharge properties of an RC circuit used to control a muting operation in the radio receiver according to the invention.

Therefore, according to another feature of the present invention, contacts $r_1$ and $r_2$ of relay 14 are released in the re-locking operation using the time constant circuit consisting of the resistor $R_1$ and the condenser $C_1$, thereby preventing noise during the re-locking operation. More specifically, a condenser $C_3$ is connected through a diode $D_3$ to the collector of transistor $Q_1$ connected to the time constant circuit which is constituted by $R_1$ and $C_1$. The terminal voltage of the condenser $C_3$ is applied to a switching circuit 15 such as Schmitt trigger circuit, for example, through a diode $D_4$ and a resistor $R_{14}$. The relay 14 is controlled by ON-OFF operation of the switching circuit. FIG. 5 is a timing chart showing the change in the terminal voltage of the condenser $C_3$. The chart will now be explained. The condenser $C_3$ is charged with a time constant $\tau_3 \approx R_2 C_3$ until a time $T_1$, after turning on the power supply. Thereafter, since the transistor $Q_1$ is turned on, the condenser $C_3$ is discharged with a time constant $\tau_4 \approx (R_{14} + R_L) C_3$ (where $R_L$ is an input impedance of the switching circuit 15). That is, as soon as the power supply is turned on, the terminal voltage of condenser $C_3$ is raised to energize the switching circuit, and then contacts $r_1$ and $r_2$ of the relay 14 connected to the switching circuit are released. Further, when the terminal voltage of the condenser $C_3$ has decreased to below the desired voltage after a time $T_3$, the contacts $r_1$ and $r_2$ of the relay are closed. Accordingly, a muting will be provided during a time elapsed of a few seconds which is determined by a time from the turn on state of the power supply to $T_3$. At the result, the generation of the unwanted signals caused at the re-locking operation can be prevented.

According to the present invention, the special lock deviation phenomenon generated by synthesizer tuners of this kind can be prevented, and the stability of tuners of this kind can be greatly increased. In addition, since the unwanted signals generated during the re-locking operation are muted during the operation, the commercial value of the tuners with this feature is enhanced. In addition, such tuners are easily operated by users.

The foregoing discussion is a description depending upon one embodiment of the invention. It will be understood, however, that various applications and modifications will readily occur to those skilled in the art, within the spirit and scope of the claimed invention.

I claim:

1. In a radio receiver having a mixer, an IF circuit and a detector connected in series, and an oscillator to generate a desired frequency of equal intervals as a local oscillator connected to said mixer, said oscillator including a variable capacitance diode connected in an AFC feedback path, the improvement comprising:
    a. pulse signal generator means connected to said variable capacitance diode for generating a pulse signal a predetermined time after power is applied to said radio receiver to temporarily vary the oscillating frequency of said local oscillator so that the oscillating frequency of said local oscillator is pulled into a frequency corresponding to a desired broadcasting station, and
    b. control means connected to receive outputs from said IF circuit and said detector for detecting when the oscillating frequency of said local oscillator is within the capture range of the desired broadcasting station and inhibiting the output of said pulse signal generator means.

2. The improvement as recited in claim 1, further comprising muting means connected to said pulse signal generator means for muting the output of said radio receiver for a predetermined time after power is applied to said radio receiver to prevent undesired noises while the oscillating frequency of said local oscillator is pulled into a frequency corresponding to a desired broadcasting station.

3. The improvement as recited in claim 1, wherein said pulse signal generator means includes:
    a. first time constant means for generating an increasing voltage signal output after power is applied to said radio receiver, and
    b. first threshold means connected to said first time constant means for generating a pulse output when said increasing voltage signal reaches a predetermining level.

4. The improvement as recited in claim 3, wherein said control means includes:
    a. rectifying means connected to said detector for producing a full wave rectified output signal, and
    b. product means connected to said IF circuit and said rectifying means for forming a control signal corresponding to the product of said full wave rectified output signal and the output of said IF circuit, said control signal being used to inhibit the output of said pulse signal generator means.

5. The improvement as recited in claim 4, further comprising muting means connected to said pulse signal generator means for muting the output of said radio receiver for a predetermined time after power is applied to said radio receiver to prevent undesired noises while the oscillating frequency of said local oscillator is pulled into a frequency corresponding to a desired broadcasting station.

6. The improvement as recited in claim 5, wherein said muting means includes:
    a. second time constant means connected to said first threshold means for generating a decreasing voltage signal output after said first threshold means generates a pulse output, and
    b. second threshold means connected to said second time constant means for generating a signal enabling the output of said radio receiver when said decreasing voltage reaches a predetermined level.

7. A radio receiver comprising:
    a. a mixer, an IF circuit and a detector connected in series,
    b. an oscillator to generate a desired frequency at equal intervals as a local oscillator connected to said mixer, said oscillator including a variable capacitance diode connected in an AFC feedback path,
    c. pulse signal generator means connected to said variable capacitance diode for generating a pulse signal a predetermined time after power is applied to said radio receiver to temporarily vary the oscillating frequency of said local oscillator so that the oscillating frequency of said local oscillator is pulled into a frequency corresponding to a desired broadcasting station, and
    d. control means connected to receive outputs from said IF circuit and said detector for detecting when the oscillating frequency of said local oscillator is within the capture range of the desired broadcasting station and inhibiting the output of said pulse signal generator means.

8. A radio receiver as recited in claim 7, wherein said pulse signal generator means includes:
    a. first time constant means for generating an increasing voltage signal output after power is applied to said radio receiver, and
    b. first threshold means connected to said first time constant means for generating a pulse output when said increasing voltage signal reaches a predetermining level.

9. A radio receiver as recited in claim 8, wherein said control means includes:
    a. rectifying means connected to said detector for producing a full wave rectified output signal, and
    b. product means connected to said IF circuit and said rectifying means for forming a control signal corresponding to the product of said full wave rectified output signal and the output of said IF circuit, said control signal being used to inhibit the output of said pulse signal generator means.

10. A radio receiver as recited in claim 9, further comprising muting means connected to said pulse signal generator means for muting the output of said radio receiver for a predetermined time after power is applied to said radio receiver to prevent undesired noises while the oscillating frequency of said local oscillator is pulled into a frequency corresponding to a desired broadcasting station.

11. A radio receiver as recited in claim 10, wherein said muting means includes:
   a. second time constant means connected to said first threshold means for generating a decreasing voltage signal output after said first threshold means generates a pulse output, and
   b. second threshold means connected to said second time constant means for generating a signal enabling the output of said radio receiver when said decreasing voltage reaches a predetermined level.

* * * * *